United States Patent [19]

Hightower et al.

[11] Patent Number: 5,428,361
[45] Date of Patent: Jun. 27, 1995

[54] LARGE TIME-BANDWIDTH CHIRP PULSE GENERATOR

[75] Inventors: Charles H. Hightower, San Clemente, Calif.; Ralph I. Kratzer, Findlay, Ohio

[73] Assignee: Rockwell International Corporation, Seal Beach, Calif.

[21] Appl. No.: 102,924

[22] Filed: Aug. 6, 1993

[51] Int. Cl.[6] .................. G01S 7/282; H03B 23/00
[52] U.S. Cl. ........................... 342/201; 342/132; 331/107 A
[58] Field of Search .............. 342/201, 132; 331/107 A

[56] References Cited

U.S. PATENT DOCUMENTS

| | | | |
|---|---|---|---|
| 3,852,746 | 12/1974 | Lowenschuss et al. | 342/132 |
| 3,945,012 | 3/1976 | Cooper | 342/132 |
| 4,047,173 | 9/1977 | Miller | 342/132 |
| 4,288,750 | 9/1981 | Newton et al. | 342/132 X |
| 4,560,961 | 12/1985 | Kestenbaum | 342/201 |
| 4,739,186 | 4/1988 | Crookshanks | 342/201 X |
| 5,019,825 | 5/1991 | McCorkle | 342/201 |

Primary Examiner—Gilberto Barrón, Jr.
Attorney, Agent, or Firm—H. Fredrick Hamann; George A. Montanye; Philip K. Yu

[57] ABSTRACT

Low time-bandwidth product linear frequency modulated chirp pulses are repetitively generated as contiguous subpulses to form a pulse of extended duration with each subpulse respectively mixed with one of a plurality of stepped intermediated frequencies so that the bandwidth of the contiguous subpulses is increased to the frequency bandwidth of all of the stepped intermediate frequencies such that the contiguous signal formed has a linearly varying frequency over the increased bandwidth and increased pulse duration, providing a large time-bandwidth product linear frequency modulated chirp waveform particularly useful in radar systems.

16 Claims, 4 Drawing Sheets

LARGE TIME-BANDWIDTH CHIRP PULSE GENERATOR

FIELD OF THE INVENTION

The present invention relates to linear frequency modulation chirp pulse generators particularly useful in radar applications. More specially, the present invention relates to an improved linear frequency modulated chirp pulse generator having a large time-bandwidth product synthesized from small time-bandwidth product chirp pulses contiguously generated and respectively mixed with stepped intermediate frequencies.

BACKGROUND OF THE INVENTION

Prior art radar systems tended to use narrower pulses to detect and resolve smaller targets. The spatial resolution of radar pulses when propagating through space is equal to $(c \times T)/2$, where T is the pulse width time and c is the speed of light. However, the power requirements of such radars increases when using narrower pulses so as to project sufficient energy for detection where the energy transmitted equal to the power times the pulse width, T. In order to avoid the use of high power systems with exceedingly narrow radar pulses, linear frequency modulation (LFM) chirp pulses having longer pulse widths, but lower power requirements, have been used. The reflected target signal is processed using Matched Filter Processing, Cross Correlation Processing, Spectrum Analyzer Processing, Stretched Pulse Compression Processing, and like compression methods, to provide improved spatial resolution of the targets. These radar transmission and compression processing methods require the use of a local LFM chirp generator.

The LFM chirp pulse is a frequency modulated pulse where the modulated frequency typically linearly increases from an initial frequency $-B/2$ to $+B/2$ over a finite time equaling a pulse width T, for example, from $-20$ MHz to $+20$ MHz, providing a 40 MHz bandwidth B, over the pulse width T, for example, 12.8 micro-seconds, modulating an intermediate center frequency, for example, 160 MHz. This modulated signal is typically stepped up and mixed to a higher radio frequency (RF) carrier prior to transmission. Various means have been employed to generate such linear frequency modulation chirp pulses. The LFM chirp pulse, modulating the intermediate frequency has a time-bandwidth product equal the pulse width time T multiplied by the bandwidth B, for example 12.8 microseconds times 40 MHz, or 512. LFM chirp pulses have been generated by various hardware means. Chief among them are Dispersive Delay Lines, Surface Acoustic Wave devices and Direct Digital Synthesis systems.

A Dispersive Delay Line device is a group of lumped circuit elements e.g. a group of the RCL circuits which generate a respective group of staggered delay signals which are summed together and which provide the LFM chirp pulse when excited by an impulse stimulus. A Surface Acoustic Wave (SAW) device is a metalized crystalline device that is also subjected to a high impulse signal to produce the linear frequency modulated chirp pulse. Due to parasitic and device geometry manufacturing limits, present Dispersive Delay Line and SAW devices provide output signals which are exceedingly attenuated due to insertion losses with concomitant LFM chirp pulse width and bandwidth limitations. Severely attenuated signals are subject to poor signal-to-noise ratios limiting the usefulness of the Dispersive Delay Line and SAW devices. The Dispersive Delay Line and SAW devices generate the LFM chirp pulse typically with limited time-bandwidth products of up to about 500.

Direct Digital Synthesis (DDS) methods of generating the LFM chirp pulse typically employ digital programmed memories having stored digitized sinusoidal values that are typically fed into a digital to analog converter, such that as the digital values are cycled into the D/A converter at an increasing rate for a certain pulse width time T, the analog converter produces the LFM chirp pulse through that pulse width. However, more power is required the faster the digital and analog circuits are operated. Intrinsic device characteristics and modest power requirements limit the speed and usefulness of such DDS systems. Present technology limitations of digital systems and analog circuits using the DDS is approaching 500 MHz switching speeds using Gallium-Arsenide processing technology, while suffering from relatively high power consumption, for example, 40 watts. While the DDS method may provide chirp pulse time-bandwidth products in excess of 500, such methods have unacceptably high power requirements.

Improved resolution of the reflected radar target signals is desired for more accurate radar target detection and recognition. The received LFM chirp pulse signal is compressed using conventional Match Filter Processing or Cross Correlation Processing methods to provide a high resolution detection. The compression methods act upon reflected received target signals to compress the received LFM chirp pulse signal into a compressed narrow pulse spike signal. The pulse width of the compressed pulse spike signal is commonly defined by its 3 db points. The pulse width of the compressed pulse spike signal is equal to $c/2B$ where B is the bandwidth of the LFM chirp pulse signal, that is, the difference between $-B/2$ and $+B/2$, or simply B. Decreased pulse width of the compressed pulse spike increases the range resolution of the target, especially applicable where individual targets within a group of moving targets, are to be accurately detected. Narrowing the pulse widths of the compressed pulse spike increases the range resolution and possible density of such compressed pulse spikes, thus allowing for a more accurate image resolution of the target or multiple targets. Thus, it is desired to increase the bandwidth of the LFM chirp signal for improved target resolution.

Equally important, it is further desired to have an improved signal-to-noise ratio of the compressed pulse spike signal. The signal-to-noise ratio depends upon the energy in the signal that is transmitted. Increasing the transmit energy increases the energy of the signal that is reflected off the target and subsequently received. The energy of the signal transmitted is equal to the power level multiplied by the pulse width of the LFM chirp signal. The longer the pulse width, the more energy transmitted at a given power transmission level. Thus, increasing the pulse width of the transmitted signal, at a given power level, increases the signal-to-noise ratio of the compressed pulse spike signal. It is therefore desired to transmit longer LFM chirp pulses, in lieu of increasing the power transmission level.

The transmitted LFM chirp pulse has a time-bandwidth product (T)(B), which is a measure of merit and potential performance of a given radar system. The detection of a target by a radar system is enhanced by increasing the LFM chirp pulse width thereby increasing the signal-to-noise ratio of the compressed pulse spike signal, at a given power transmission level, and is enhanced by increasing the bandwidth thereby decreasing the compressed pulse spike pulse width time for increased range resolution. It is desirable to improve the time-bandwidth products of LFM chirp pulses, with a longer pulse width time T over a wider bandwidth B. The generation of LFM chirp pulses with time-bandwidth products greater than 10,000 is difficult and beyond present day technologies. Thus, there exists a continuing need for improved LFM chirp pulse generators having extended pulse widths and extended bandwidths producing large time-bandwidths products greater than 10,000, with low power requirements and within present day technology limitations. The problems of the prior art low time-bandwidth product of LFM chirp pulse generators are solved or reduced using the present invention.

SUMMARY OF THE INVENTION

Figure 1A:
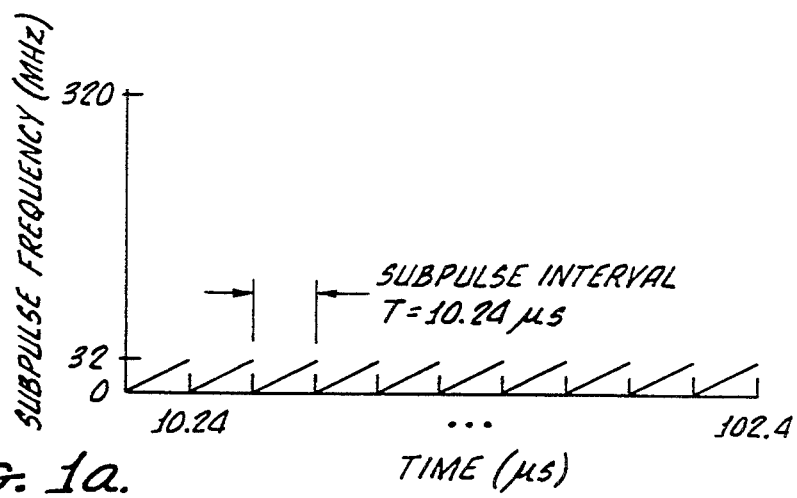
FIG. 1a is a graph of ten contiguous LFM subpulses each having a low time-bandwidth product.

An object of the present invention is to generate a large time-bandwidth product LFM chirp pulse.

Another object of the present invention is to generate a large time-bandwidth product of an LFM chirp pulse signal using contiguous LFM chirp subpulses.

A further object of the present invention is to generate a large time-bandwidth product of an LFM chirp pulse signal using contiguous LFM subpulses without significant transient distortion when switching from one subpulse to another.

Still a further object of the present invention is to generate contiguous LFM chirp subpulses by sequentially selecting LFM chirp subpulse generators and by respectively sequentially selecting intermediate frequency generators.

Yet a further object of the present invention is to generate an LFM chirp pulse signal having a large time-bandwidth product using similar contiguous LFM subpulses respectively mixed with intermediate frequencies using a minimum number of LFM chirp subpulse generators and intermediate frequency generators.

Yet another object of the present invention is to generate contiguous similar LFM chirp subpulses mixed with respective intermediate frequencies of a group of intermediate frequencies forming a staircase of stepped intermediate frequencies.

A low time-bandwidth chirp subpulse is generated and mixed to a desired center intermediate frequency. A plurality of chirp subpulses are contiguously generated and respectively mixed with intermediate frequencies of a plurality of intermediate frequencies. This contiguous mixed chirp signal has an extended pulse width equaling the sum of the pulse widths of all of the LFM chirp subpulses. In the case where all of the chirp subpulses have the same pulse width, the extended pulse width of the contiguous chirp pulse is equal to the number of subpulses (N) multiplied by the pulse width, (T) of each subpulse, that is, the extended pulse width is equal to (N)(T). The contiguously mixed signal also has an extended bandwidth. In the case of where the plurality of intermediate frequencies are multiples of a predetermined intermediate frequency and form a frequency staircase, the effective bandwidth B of the contiguous LFM chirp pulse is equal to the number of intermediate frequencies, that is, the number of LFM chirp subpulses, (N), multiplied by the intermediate frequency step (F). The effective bandwidth B is equal to (N)(F). The effective time-bandwidth products of the contiguous chirp pulse signal equals (N)(T) multiplied by (N)(F). Thus, the effective time-bandwidth product of the contiguous chirp pulse signal can be increased by the square of the number of contiguous pulses. By using, for example, ten contiguous pulses, the effective time-bandwidth product is one hundred times the time-bandwidth product of a single subpulse in the case where the bandwidth of the subpulse is also equal to F.

In the preferred form, and instead of using, for example, ten different LFM chirp generators and ten different intermediate frequency generators, the present invention uses two similar LFM chirp generators generating approximately the same LFM chirp subpulses in combination with two respective Phase Lock Loops (PLL) generating all of the intermediate frequencies. While the chirp subpulses of one LFM chirp generator is mixed with the intermediate frequency of one PLL, the other PLL locks into a stable but higher intermediate frequency so that the intermediate frequencies are stable when switching between contiguous subpulses. As the contiguous chirp subpulses are generated and mixed, the large time-bandwidth chirp pulse generator switches, that is "ping-pongs" between the two LFM chirp generators and synchronously between the two PLL thereby reducing the number of components, reducing power consumption and reducing switching phase discontinuities between of the LFM chirp subpulses of the contiguous chirp pulse signal.

Furthermore, when switching from one contiguous LFM chirp subpulse to the next, certain transient distortion will occur. PIN diode switching circuits with nanosecond switching times limit transient distortion when switching from one LFM chirp subpulse to the next one.

The large time-bandwidth chirp pulse generator has time-bandwidth products exceeding 10,000 with ping-pong switching of the two intermediate frequency PLLs and two respective LFM chirp pulse generators. These and other advantages will become more apparent from the following detailed description of the preferred embodiment.

DETAILED DESCRIPTION OF THE PREFERRED EMBODIMENT

Figure 1B:
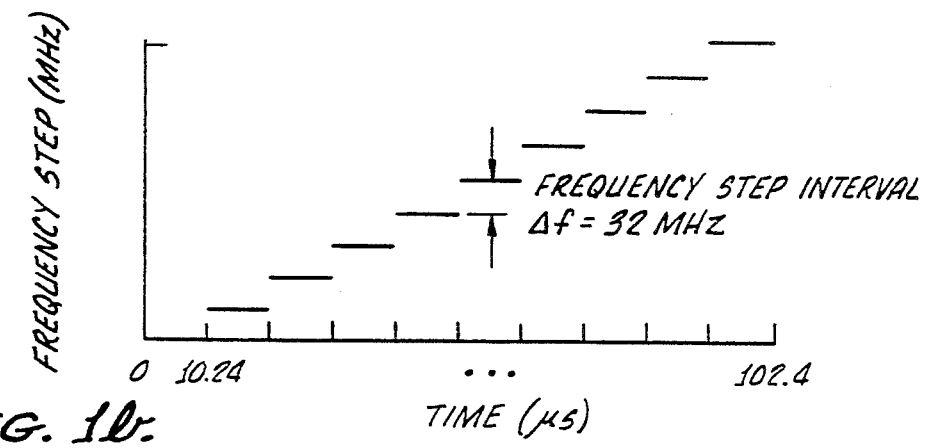
FIG. 1b is a graph of a frequency step generator having ten intermediate frequency steps wherein each frequency step is increased over the prior frequency step.
Figure 1C:
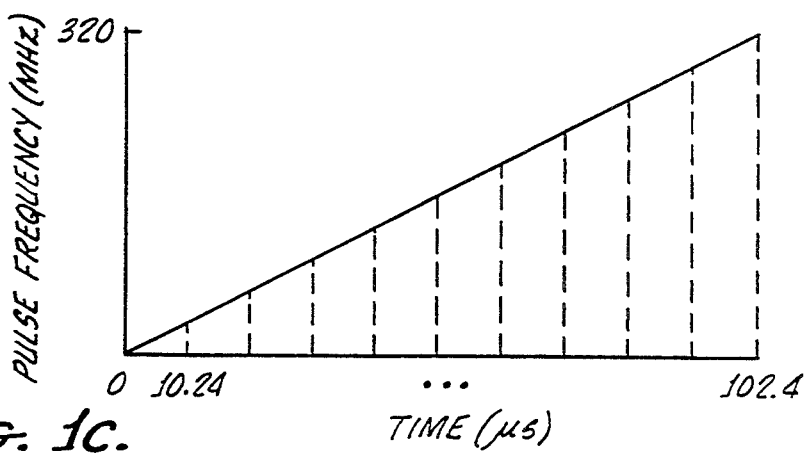
FIG. 1c is a graph adding together the frequency steps and contiguous LFM subpulses producing an extended pulse width over an extended bandwidth providing a large time-bandwidth product.

Referring to FIGS. 1a, 1b and 1c, a plurality of contiguous LFM chirp subpulses are shown by example in FIG. 1a. Each subpulse has a 10.24 micro-second pulse width time T, and each subpulse has a frequency bandwidth of 32 MHz, that is, the frequency range of each subpulse linearly varies from zero to 32 MHz during the 10.24 micro-second subpulse time interval. The time-bandwidth product of each of the subpulses is equal to the subpulse pulse width time, 10.24 micro-seconds, multiplied by the subpulse bandwidth, 32 MHz, which equals a 327.68 time-bandwidth product. By example, ten contiguous subpulses are generated having an accumulative contiguous pulse width time of 102.4 microseconds.

A frequency staircase is shown in FIG. 1b wherein the frequency staircase has, by example, ten equal frequency steps, each of which is incremented by 32 MHz over the prior frequency step, with the first frequency step specified at zero Hertz. The frequency staircase has a frequency range from zero to 288 MHz. The frequency staircase is synchronously stepped with the LFM chirp subpulses shown in FIG. 1a. By way of example, the frequency steps of staircase of FIG. 1b are equal to the bandwidth of the subpulses of FIG. 1a.

FIG. 1c depicts the frequency summation of the LFM chirp subpulses of FIG. 1a and the frequency staircase of FIG. 1b. This sum produces a linearly increasing frequency modulated extended pulse having a frequency range, that is, a bandwidth from zero to 320 MHz over an extended pulse width of 102.4 microseconds. The time-bandwidth product of this extended contiguous LFM chirp pulse is 32,768.

The extended contiguous chirp pulse of FIG. 1c is preferred but other forms of extended chirp pulses may serve equally as well. By example, in FIG. 1b, the slope of the frequency staircase is linear and positive. However, negative frequency staircase slopes and non-linear frequency staircase slopes, with, for example, unequal frequency steps may be more useful in particular applications. Furthermore, the number of steps, that is, the number of subpulses may vary. Further still, the pulse width time of the subpulses may not be equal to each other, for example, odd numbered subpulses may have a longer pulse width time or a larger bandwidth than the even numbered subpulses. These complex variations may, for example, be useful to improve electronic counter-counter-measures to prevent jamming of a particular radar system. Moreover, these subpulses and frequency staircases may be dynamically changed during operational practice of the invention. Thus, different subpulses and frequency steps for variable complex extended LFM chirp pulse signals are contemplated.

The positive linear slope of the frequency staircase and the use of substantially similar LFM chirp subpulses is preferred for ease of design and manufacture. For example, the positive linear slope frequency staircase may be provided by a comb frequency generator having several output frequencies, and the contiguous LFM chirp subpulses may be provided by a group of similar respective LFM chirp pulse generators, controlled and respectively mixed in sequential synchronization. However, this approach, while simpler in conceptual design, may be cost or power prohibitive by an excessive number of components.

Figure 2:
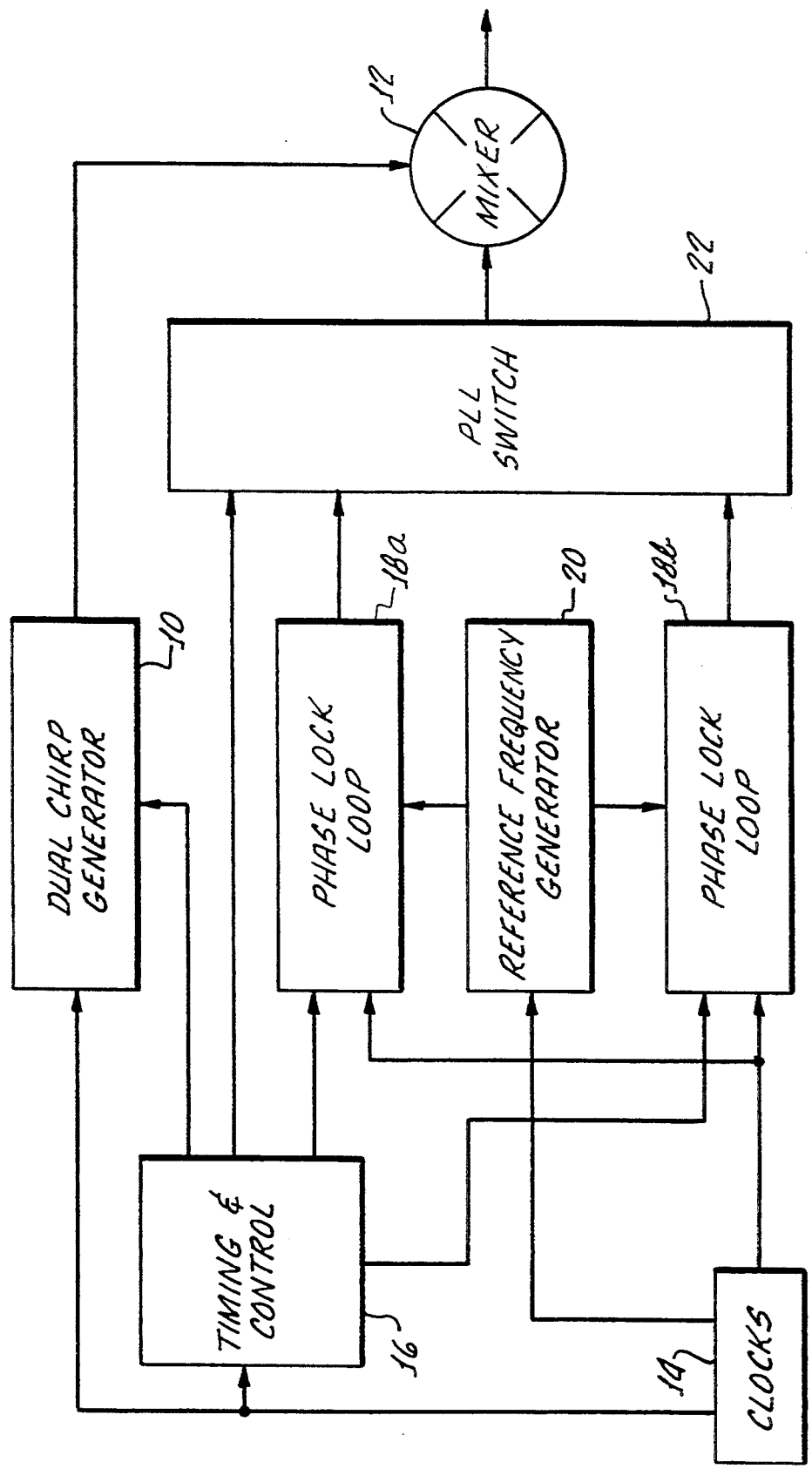
FIG. 2 is a block diagram of a large time-bandwidth pulse generator.

A large time-bandwidth contiguous LFM chirp pulse generator is shown in FIG. 2. A dual chirp generator 10 is used to provide contiguous LFM chirp subpulses to a mixer 12 which provides the large time-bandwidth contiguous LFM chirp pulse signal. The dual chirp generator 10 includes a plurality of similar LFM chirp generators, (not shown), for example two identical generators providing LFM chirp subpulses of equal pulse width time and frequency bandwidth. The dual chirp generator 10 is stimulated by a clock signal from the clocks 14 and is controlled by timing and control 16. Conceptually, clocks 14 are inherently used for timing and control functions. Timing and control 16 also controls the operation of two phase lock loops (PLLs) 18a and 18b, a reference frequency generator 20 and a phase lock loop switch (PLL switch) 22. The PLL switch 22 is used to select one of the outputs from a number of PLLs 18, which number is two in the preferred form of the invention. The PLL switch 22 is also used to minimize phase discontinuity when switching from one PLL intermediate frequency to another, that is, from one LFM chirp subpulse to the next. The PLL switch 22 routes an intermediate frequency to the mixer 12. The mixer 12, which is preferably a single side-band mixer, respectively mixes the intermediate frequencies from the PLLs 18 with contiguously generated LFM chirp subpulses from the dual chirp generator 10.

The clocks 14 provide clocking signals to drive the PLLs 18, frequency generator 20 and timing and control 16. The clocks 14 provide the PLLs 18 with an input clocking signal while the reference frequency generator 20 provides the PLLs 18 with a high frequency reference signal. The PLLs 18, which are controlled by timing and control 16 and driven by the input clock signal from the clocks 14, use the high frequency signal from the reference frequency generator 20 to generate stable locked intermediate frequencies within a stepped frequency staircase.

In the preferred form of the invention, the two LFM chirp generators, (not shown in FIG. 2), of the dual chirp generator 10, provide contiguous LFM chirp subpulses, for example, eight subpulses, with each of the two LFM chirp generators providing, for example, four alternating subpulses. The LFM subpulses are respectively mixed with intermediate frequencies provided by the PLLs 18. For example, the odd LFM chirp subpulses are respectively mixed with four different intermediate frequencies generated by the first PLL 18a, while the even LFM chirp subpulses are respectively mixed with the four different intermediate frequencies generated by the second PLL 18b.

The PLLs 18 require a finite amount of time to lock up and synchronize its clock input with its reference frequency. This finite amount of time will create unacceptably high phase discontinuity at the output of the mixer 12 if an unstable and unlocked PLL intermediate frequency is mixed with an LFM chirp subpulse. The advantage of a dual chirp generator 10 in combination with the dual PLLs 18, lies in the ability to ping-pong, that is, to rapidly and synchronously switch between different locked intermediate frequencies when switching from one LFM chirp subpulse to the next. The mixing of a first LFM subpulse with the first stable intermediate frequencies over the subpulse width time duration, provides sufficient time for the next intermediate frequencies to lock up and stabilize at the next intermediate frequency that will be mixed during the next contiguous LFM subpulse. This synchronous switching of stable PLL intermediate frequencies reduces phase discontinuities of the extended chirp signal. The use of only two LFM chirp subpulses generators of the dual chirp generator 10 and the use of only two PLLs 18 also reduces the number of components required to generate an extended chirp pulse signal with many contiguous subpulses.

It then follows that the large time-bandwidth generator of FIG. 2 uses ping-ponging which is the alternating selection of the LFM subpulse generators of the dual chirp generator 10 and the synchronous alternating selection of the PLLs 18. The two chirp generators of the dual chirp generator 10 synchronously operate with respective PLLs 18. The extended chirp pulse generator of FIG. 2, thus ping-pongs between one chirp generator and one PLL, e.g. 18a, to the other chirp generator and the other PLL, e.g. 18b. This ping-ponging continues during the extended pulse width time for a finite number of subpulses, for example 8 subpulses. Each of the PLLs 18 provides, for example, four intermediate frequencies, and therefore, each of the two LFM chirp subpulse generator provides, for example, four subpulses. This ping-ponging approach enables the generation of a very high number of contiguous subpulses while only requiring two PLLs 18 and two LFM chirp generators within the dual chirp generator 10, for cost and power savings, while minimizing the potential of large phase discontinuities when switching from one LFM chirp subpulse to the next.

Figure 3A:
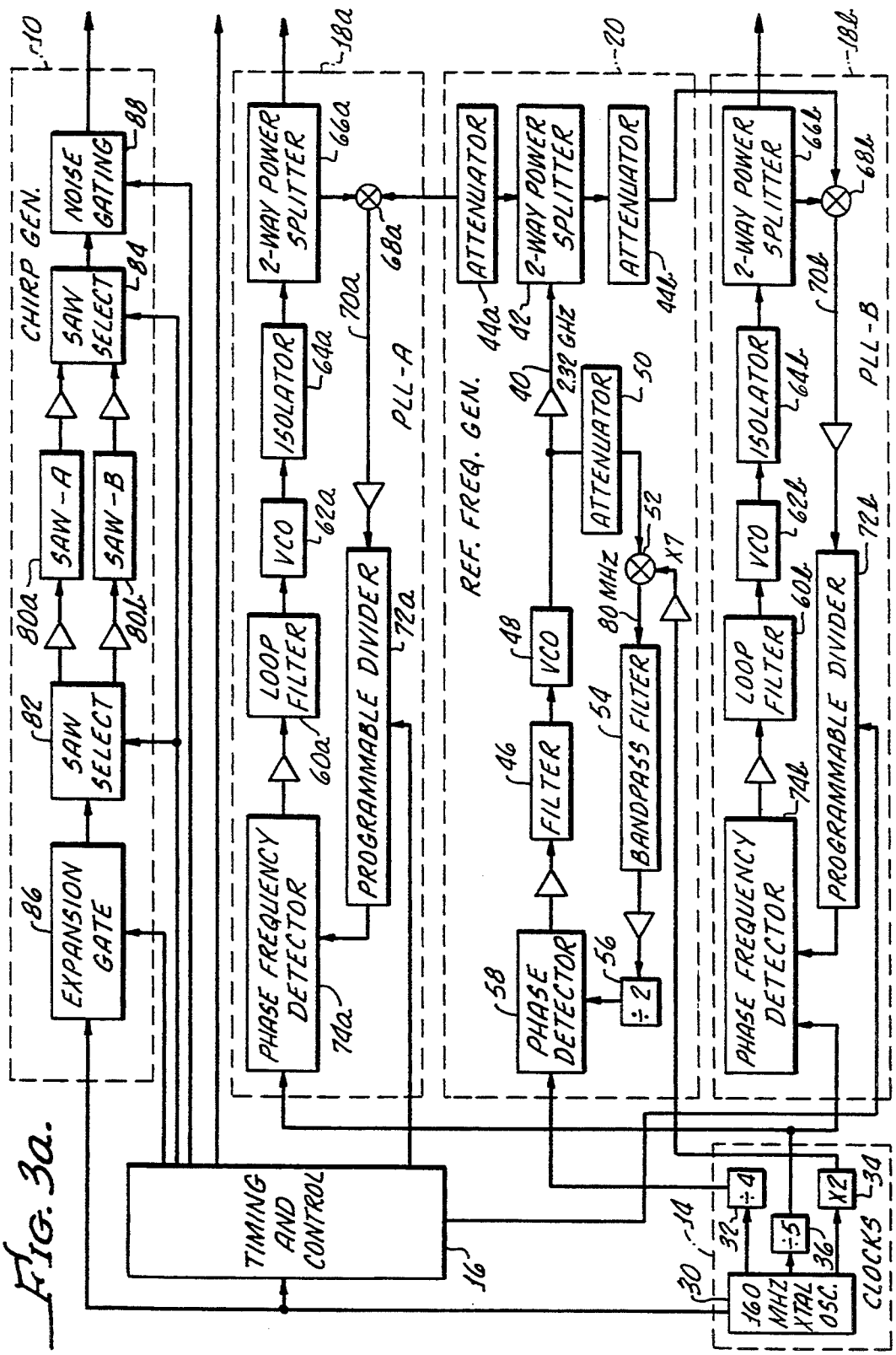
FIG. 3(a-b) is a detailed block diagram of the large time-bandwidth pulse generator.
Figure 3B:
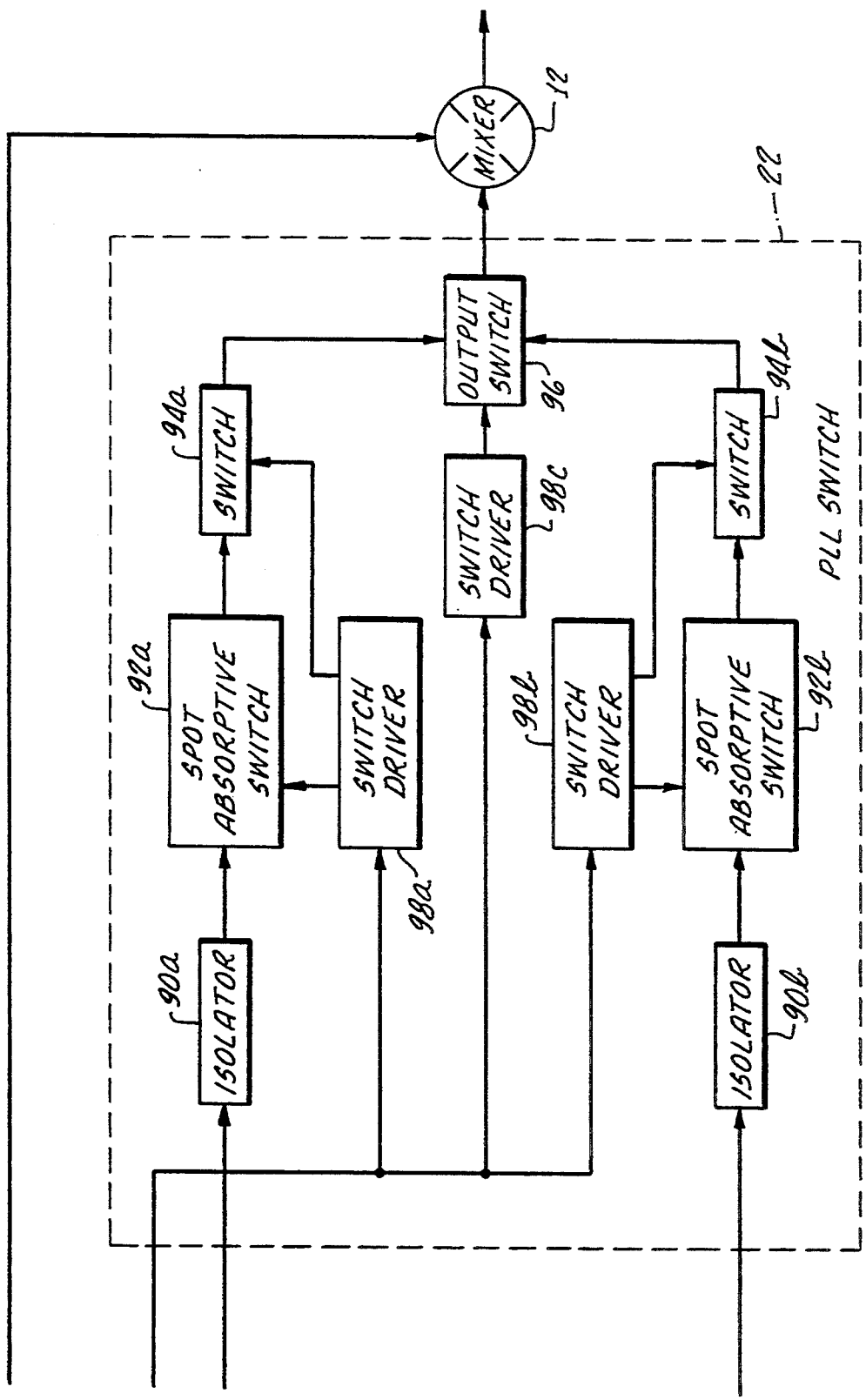

Referring to FIG. 3, a large time-bandwidth LFM chirp pulse generator is shown having the same general overall architecture of generator of FIG. 2. The generator of FIG. 3 has the clocks 14, mixer 12 and the timing and control 16. The generator of FIG. 3 also has the dual chirp generator 10, the two PLLs (PLL-A and PLL-B) 18a and 18b, the PLL switch 22, and the reference generator 20, all of which having internal amplifiers shown as triangular blocks but without reference designations. These amplifiers are used for signal isolation and for compensation of signal attenuation.

The clocks 14 include a 160 MHz crystal oscillator 30 driving the dual chirp generator 10 and the timing and control 16. The clocks 14 also include a divide-by-four clock circuit 32 providing 40 MHz signal and a multiply-by-two clock circuit 34 providing a 320 MHz signal, both of which drives the reference frequency generator 20. The clocks 14 further include a divide-by-five clock circuit 36 providing a 32 MHz signal which drives the PLLs 18a and 18b.

Referring to the reference frequency generator 20, a 2.32 GHz output signal on line 40 is split through a two way power splitter 42 and attenuated by attenuators 44a and 44b respectively providing the PLLs 18a and 18b with stable 2.32 GHz high frequency reference signal. The reference frequency generator 20 is a phase lock loop circuit which converts its 40 MHz input signal from the circuit 32 to the 2.32 GHz reference signal using a filter 46 and a voltage controlled oscillator (VCO) 48. The 2.32 GHz output signal of VCO 48 is attenuated by an attenuator 50 and mixed with the 320 MHz input signal from the clock circuit 34 using a mixer 52. The 2.32 GHz and the 320 MHz signal are mixed by the mixer 52 to provide an 80 MHz signal. It is desired to have a high amplitude 2.32 GHz reference signal for improved signal-to-noise ratio as the 2.32 GHz reference signal is conducted, but high amplitude signals cause unwanted noise when mixed. The attenuator 50 lowers the amplitude of the 2.32 GHz signal so as to minimize noise and harmonic distortion which would otherwise be generated by the mixer 52 when subjected to high level input signals. Likewise, attenuators 44a and 44b also lower the amplitude of the 2.32 GHz reference signal prior to conduction to the PLLs 18a and 18b. The mixer 52 is a times-seven mixer i.e. a seventh harmonic mixer. The mixer 52 multiplies the 320 MHz input signal from the clock circuit 34 to 2.24 GHz. The seventh-harmonic mixer 52 provides the 80 MHz output signal which is the difference between 2.32 GHz and 2.24 GHz, along with other harmonic signals. The 80 MHz signal is then isolated by a bandpass filter 54 to eliminate harmonic signals while passing only the 80 MHz signal. A divide-by-two circuit 56 steps down the 80 MHz signal to 40 MHz which is fed into a phase detector 58. The phase detector 58 detects the phase relationship between the 40 MHz signal from the clock circuit 32 and the 40 MHz signal from the divide-by-two circuit 56. The phase detector 58 drives the filter 46 and VCO 48 to lock the reference frequency generator 20 to the 2.32 GHz high frequency reference signal.

The phase lock loop (PLL-A) 18a and (PLL-B) 18b are identical in hardware design and respectively discussed in tandem, though controlled to operate at different locked intermediate frequencies. PLL loop filters 60 drive VCOs 62 providing intermediate frequencies which are isolated by isolators 64 and split by two way power splitters 66. The isolators 65 are used for impedance matching for optimum power transfer and for noise isolation from noise generated by the mixers 68 or by the PLL switch 22. The power splitters 66 provide the PLL switch 22 and mixers 68 with the intermediate frequencies. The PLL intermediate frequencies and the 2.32 GHz reference frequency drive mixers 68 which then provide an internal PLL signal on lines 70 equal to the frequency difference therebetween. Programmable dividers 72 are controlled and loaded by timing and control 16 to divide down the PLL internal frequency on line 70 provided by the mixers 68. The programmable dividers 72 then provide a 32 MHz signal to phase frequency detectors 74 which detect the phase difference between the 32 MHz input signal from the clocks circuit 36 and the 32 MHz signal from the programmable dividers 74, so as to properly drive the loop filters 60 and VCOs 62 to operate at the desired intermediate frequency. The phase detectors 74 drive the filters 60 and VCOs resulting from phase differences and phase coherency between the 32 MHz inputs of the phase detectors 74 to stabilize and lock the PLLs 18 at the desired intermediate frequency.

Referring to the dual chirp generator 10, odd Surface Acoustic Wave device (SAW-A) 80a and even Surface Acoustic Wave device (SAW-B) 80b, are alternatively selected during the generation of a large time-bandwidth chirp pulse signal. The SAW devices 80a and 80b both provide identical 32 MHz, i.e., ±16 MHz, bandwidth LFM chirp subpulses centered at 160 MHz. SAW select 82 and SAW select 84 are controlled by timing and control 16 and used to alternately select one of the two SAW devices 80. The expansion gate 86 is also controlled by timing and control 16 and is used to generate an impulse stimulus signal derived from the 160 MHz clock signal from the clock oscillator 30. The impulse stimulus signal from the expansion gate 86 is fed into the SAW devices through the SAW select 82. The SAW select 80 routes the impulse stimulus to the proper SAW device 80 while SAW select 84 routes the LFM chirp subpulse to noise gating 88 which in turn routes the subpulse signal to the mixer 12.

The LFM chirp subpulse signal generated by the SAW devices 80 actually begins prior to and last longer than the desired subpulse pulse width time. That is, the SAW devices 80 actual produce a LFM chirp subpulse with a greater than 16 MHz bandwidth and with a greater than 10.24 micro-second pulse width time. The impulse signal which is fed into the SAW devices 80 is transmitted to one of SAW devices 80 well in advance of the desired LFM chirp subpulse signal sent to the mixer 12, and the subpulse signal generated by the newly stimulated SAW device 80 lasts longer than the desired pulse width time. Thus, the alternating chirp subpulses at the SAW 80 outputs overlap their beginning and end. However, SAW select 82 and 84 are used to not only alternately select the SAW devices 80, but SAW select 82 is also used route an impulse stimulus to prematurely excite the SAW devices 80, while SAW select 84 is also used to properly truncate both the beginning and ending of each generated LFM chirp subpulse signal to the desired subpulse pulse width time and resulting desired 32 MHz bandwidth. Lastly, noise gating 88 is used to disable an output signal and provide noise isolation inbetween extended chirp pulse signals, that is, between the mixer 12 and the dual chirp generator 10.

Direct Digital Synthesis (DDS) methods may be used to generate LFM chirp subpulses and eliminate the need for truncation of the overlapping beginning and ending portion of SAW chirp subpulse pulse width by virtue of the inherent fast and accurate switching of digital processing systems. Such DDS systems may further minimize phase discontinuities between LFM chirp subpulse at the output of the mixer 12. SAW devices 80 are used in the preferred form because of cost and power requirements, and simplicity in design, despite high insertion losses.

Referring to the PLL switch 22, isolators 90a and 90b are used to isolate noise generated by the mixer 12 from the PLLs 18a and 18b, respectively. Single-pole double-throw absorptive switches 92 and switches 94 are connected in series and are used to conduct the intermediate frequencies from the PLLs 18 to an output switch 96 which is used to select one of the PLLs 18. The absorptive switches 92 are connected to a match load, (not shown), for impedance matching when a respective PLL 18 is not selected, to prevent noise reflection back into the PLLs 18. The output switch 96 conducts the selected intermediate frequency of the selected PLL 18 to the mixer 12. It is known that a series of switches improves mixer noise isolation. In the preferred form of the invention, three semiconductor switches 92, 94 and 96 are used, each providing up to 30 db in noise attenuation, in addition to the noise attenuation provided by the isolators 90. The semiconductors are preferably PIN diode devices having a bias voltage applied by switch drivers 98. The PIN diodes have nano-second switching times tending to minimize phase discontinuity at the output of the mixer 12 when switching between the intermediate frequencies of the two PLLs 18.

Switch drivers 98 control the operation of switches 92, 94 and 96 to route the desired intermediate frequency to the single side-band mixer 12. A single sideband mixer 12 is used in the preferred form of the invention to eliminate unnecessary and unwanted mixer output image signals. Switch drivers 98 are controlled by timing and control 16. Timing and control 16 is a digital sequencer providing timing and control of the extend LFM chirp pulse generator, but can be implemented by individual digital logic circuits or by a programmed microcomputer, or other like means.

The dual chirp generator 10 provides, by example, ten contiguous 10.24 micro-second, 32 MHz bandwidth, 160 MHz centered, LFM chirp subpulses. These chirp subpulses further modulate the PLL intermediate frequencies by using the single sideband mixer 12 providing an extended LFM chirp pulse signal. The odd PLL-A 18a provides active intermediate frequencies during odd sequenced chirp subpulses while the even PLL-B 18b provides active intermediate frequencies during even sequenced chirp subpulses.

Referring to the hereinbelow Ping-Pong PLL Frequency Table, and referring to FIG. 3, for each entry in the table, the 2.32 GHz reference frequency is subtracted from the specified active operating intermediate frequency of the PLLs 18, with this difference divided by the specified program divider loaded into the divider 72, with this quotient always equaling the 32 MHz input signal from the clock circuit 36. For example, (3.664 GHz−2.32 GHz)/42=32 MHz during subpulse one, and for another example, (3.824 GHz−2.32 GHz)/47=32 MHz during subpulse six. As is apparent from the table, odd PLL-A 18a and SAW-A 80a, ping-pong with even PLL 18b and SAW 80b.

| Subpulse Sequence Number | Ping-Pong PLL Frequency Table | | | | SAW Device Selected |
|---|---|---|---|---|---|
| | Odd PLL-A | | Even PLL-B | | |
| | Freq. (GHz) | Program Divider | Freq. (GHz) | Program Divider | |
| 1 | 3.664 | 42 | — | — | A |
| 2 | — | — | 3.696 | 43 | B |
| 3 | 3.728 | 44 | — | — | A |
| 4 | — | — | 3.760 | 45 | B |
| 5 | 3.792 | 46 | — | — | A |
| 6 | — | — | 3.824 | 47 | B |
| 7 | 3.856 | 48 | — | — | A |
| 8 | — | — | 3.888 | 49 | B |
| 9 | 3.920 | 50 | — | — | A |
| 10 | — | — | 3.952 | 51 | B |

From the forgoing specified PLL frequencies and divider values, the internal frequencies on line 70a will vary between 1344 MHz and 1600 MHz, and the internal frequencies on line 70b will vary between 1376 MHz and 1632 MHz, as the subpulses are generated in sequence. It is now apparent that as the sequence of chirp subpulses is generated, timing and control 16 loads the programmable dividers 72 with new values to lock the PLLs 18 into the desired intermediate frequency within a frequency staircase having 32 MHz frequency steps. It is now equally apparent that this load time and the time required to lock up one of the PLLs, 18a or 18b, does not effect the performance of the extended chirp pulse generator, because the other PLL 18b or 18a, respectively, is used during this time to drive the output mixer 12 with the current intermediate frequency.

While those skilled in the art may design large time-bandwidth product LFM chirp signal generators having modifications and enhancements over the herein preferred chirp subpulse generator, intermediate frequency generators and mixer designs, those modifications and enhancements may nonetheless fall within the spirit and scope of the following claims.

What is claimed is:

1. A linear frequency modulated pulse signal generator comprising,
   a plurality of linear frequency modulators for generating a plurality of contiguous linear frequency modulated subpulses,
   an intermediate frequency means for generating a plurality of intermediate frequencies, a mixer means for mixing together said linear frequency modulated subpulses and said intermediate frequencies, and control means connected to said linear frequency means and to said intermediate frequency means, said control means for controlling the generation of a plurality of contiguous linear frequency modulated subpulses respectively mixed with said plurality of intermediate frequencies.

2. The generator of claim 1 wherein said linear frequency modulating means is a plurality of surface acoustic wave devices.

3. The generator of claim 1 wherein said intermediate frequency means is a comb frequency generator means.

4. The generator of claim 1 wherein said mixer is a single side-band mixer.

5. The generator of claim 1 wherein said linear frequency modulating means is a plurality of direct digital synthesizers.

6. The generator of claim 1 wherein said intermediate frequency means is a plurality of phase lock loops each of which providing one or more of said plurality of intermediate frequencies.

7. The generator of claim 1 wherein said control means provides control signals to stimulate said linear frequency modulating means and select said intermediate frequencies.

8. An extended linear frequency modulated pulse signal generator comprising, contiguous chirp generator means having two chirp pulse generators for alternately providing a plurality identical linear frequency modulated subpulses in contiguous sequence, an intermediate frequency means for generating intermediate frequencies, a mixer means for respectively mixing together said subpulses with said intermediate frequencies over a finite number of contiguously generated chirp subpulses, and control means connected to said contiguous chirp generator means and to said intermediate frequency means, said control means for stimulating said alternating contiguous subpulses respectively mixed with said intermediate frequencies.

9. The generator of claim 8 wherein said two chirp pulse generators are two surface acoustic waves alternately stimulated by said control means., 10. The generator of claim 8 wherein said intermediate frequency means comprises a plurality of phase lock loops for providing said intermediate frequencies, and a phase lock switching means controlled by said control means for sequentially selecting said plurality of phase lock loops.

11. The generator of claim 8 wherein said intermediate frequency means comprises two phase lock loops alternately selected by said control means to provide said intermediate frequencies in sequence for respective mixing with said alternating contiguous chirp subpulses.

12. An extended linear frequency modulated pulse signal generator comprising, two chirp pulse generators for alternately providing identical linear frequency modulated subpulses in contiguous sequence, two phase lock loops for providing alternating intermediate frequencies in frequency steps forming a frequency staircase, a mixer for respectively mixing together said subpulses with said intermediate frequencies over a finite number of contiguously generated subpulses and frequency steps, a phase lock loop switch means for alternately selecting said plurality of intermediate frequency for conduction to said mixer, a reference frequency generator means for providing said phase lock loops with a high frequency reference signal, control means connected to said two chirp pulse generators and said two phase lock loops, said control means for stimulating, selecting and controlling the alternating generation of said contiguous subpulses respectively mixed with said intermediate frequencies, and clocking means for providing reference signals to said two phase lock loops, said reference frequency generator and said control means.

13. The generator of claim 12 wherein said control means alternately stimulates and selects said two chirp subpulse generators and synchronously alternately respectively selects said phase lock loops.

14. The generator of claim 12 wherein said phase lock loops comprises a loop mixer for mixing alternate ones of said intermediate frequencies with said high frequency reference signal, said loop mixer providing an internal frequency signal, and a divider for storing values loaded by said control means, said divider dividing down said internal frequency signal by one of said values for generating a frequency signal equal to said frequency step.

15. The generator of claim 12 wherein said clocking means comprises, an internal oscillator for providing a clocking signal, and clock circuits driven by said internal oscillator, said clock circuits for providing said phase lock loops with a frequency step signal and for providing said reference generator with a reference signal.

16. The generator of claim 12 wherein said phase lock loops generate a frequency staircase of equal frequency steps, said bandwidth of said subpulses equals each one of said frequency steps, and said mixer provides an extended linear frequency modulated pulse signal with a linear and positive slope frequency staircase derived from contiguously mixing said subpulses and said intermediate frequencies.

* * * * *